United States Patent [19]

Moser et al.

[11] Patent Number: 4,626,793
[45] Date of Patent: Dec. 2, 1986

[54] RECEIVER AMPLIFIER FOR AMPLIFICATION OF A PHOTOELECTRIC CURRENT

[75] Inventors: Helmut Moser; Karl Militzer, both of Heilbronn, Fed. Rep. of Germany

[73] Assignee: Telefunken Electronic GmbH, Heilbronn, Fed. Rep. of Germany

[21] Appl. No.: 817,781

[22] Filed: Jan. 10, 1986

Related U.S. Application Data

[63] Continuation of Ser. No. 628,652, Jul. 6, 1984.

[30] Foreign Application Priority Data

Jul. 19, 1983 [DE] Fed. Rep. of Germany ....... 3325926

[51] Int. Cl.[4] .................... H03F 17/00; H01J 40/14
[52] U.S. Cl. .................................. 330/59; 250/214 A
[58] Field of Search ................. 330/59; 307/311, 520, 307/522; 250/214 A, 214 R, 206

[56] References Cited

U.S. PATENT DOCUMENTS 3,891,319 6/1975 Meinke ............................... 330/149
3,902,060 8/1975 Neuner ............................... 250/206

FOREIGN PATENT DOCUMENTS 2811726 6/1979 Fed. Rep. of Germany .
2759215 7/1979 Fed. Rep. of Germany .
2301945 4/1982 Fed. Rep. of Germany .

OTHER PUBLICATIONS

M. Cappa, "High Sensitivity, Wide Range Photo-Amplifier", IBM Tech. Dis. Bulletin, vol. 21, No. 8, pp. 3115-3116, Jan. 1979.
Electronikpraxis, No. 7, Jul. 1980, pp. 26-28.
Pitsch, "Lehrbuch der Funkempfangstechnik, Akademischer Verlags Ges. Geest und Portig KB," Leipzing 1948, pp. 492 and 493.

Primary Examiner—Gene Wan
Attorney, Agent, or Firm—Spencer & Frank

[57] ABSTRACT

A receiver amplifier for amplifying a photoelectric current produced by a light-sensitive semiconductor component. The amplifier includes an amplifier transistor, a capacitor connected between the light-sensitive conductor component and the amplifier transistor for isolating signals with a frequency below a certain threshold delivered by the semiconductor components from the amplifier transistor, and a second transistor connected to the amplifier transistor for producing a current which compensates for changes in the current produced by the light-sensitive semiconductor component in response to light pulses.

7 Claims, 1 Drawing Figure

RECEIVER AMPLIFIER FOR AMPLIFICATION OF A PHOTOELECTRIC CURRENT

This application is a continuation of application Ser. No. 628,652, filed July 6, 1984.

BACKGROUND OF THE INVENTION

The invention relates to a receiver amplifier for amplification of a photoelectric current with a light-sensitive semiconductor component, in particular, a photodiode, and with an amplifier transistor.

As a rule, known infrared receiver amplifiers operate with supply voltages which are larger than 12 volts. A bias voltage is thereby obtained for the infrared receiver diode—reverse-biased—which reduces the capacitance of the receiver diode to the extent that transmission also of short IR pulses down to 10 $\mu$sec is possible. Known circuits operating with lower supply voltage (e.g. 5 volts) have the disadvantage that the operating resistance of the circuit must be very low if the ambient luminosity can be relatively high.

SUMMARY OF THE INVENTION

The object of the invention is to provide a receiver amplifier for amplification of photoelectric currents which enables, in spite of a low supply voltage of, e.g., 5 volts, with high ambient luminosity and a relatively high operating resistance, short light pulses, for example, IR pulses to be processed.

According to the invention, there is provided a receiver amplifier for amplification of a photoelectric current with a light-sensitive semiconductor component and an amplifier transistor, wherein there is connected between the light-sensitive semiconductor component and the amplifier transistor a coupling capacitor which is of such dimensions as to keep signals with a frequency below a certain threshold delivered by the light-sensitive semiconductor component away from the amplifier transistor. In addition, there is provided a transistor for countercoupling which provides such a current that this current compensates a current change caused by light pulses at the light-sensitive semiconductor component.

The amplifier according to the invention enables use of operating resistances which are higher than 300 kohm and processes light pulses with a duration which is less than 5 $\mu$sec.

In accordance with a further development of the invention, a transistor is provided for compensation of the collector base capacitance. This transistor is connected at the emitter side to the collector of the amplifier transistor and at the collector side to the base of the countercoupling transistor. The emitter of the countercoupling transistor is connected to the coupling capacitor via a resistor.

BRIEF DESCRIPTION OF THE DRAWING

The invention will now be described in greater detail, by way of examples, with reference to the drawing, in which the FIGURE shows an amplifier for infrared light.

DESCRIPTION OF THE PREFERRED EMBODIMENTS

Figure 1:
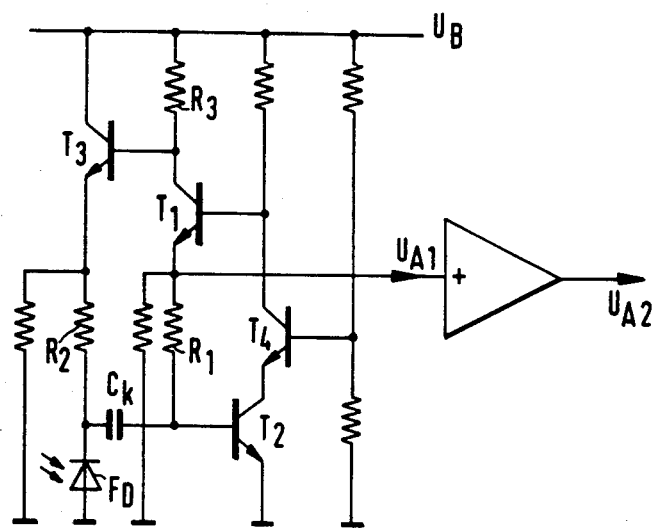

In the amplifier for infrared light shown in the FIGURE, the infrared diode (FD) which converts infrared light into a corresponding photoelectric current is located in the preamplifier. Slow changes in the luminosity prevailing in the range of the photodiode do not become conspicuous at the base of the transistor (T2) since the photoelectric current (fraction) corresponding to the slow luminosity change is not transmitted from the coupling capacitor ($C_k$) to the base of the transistor T2. Since, in the case in question, on account of appropriate dimensions of the coupling capacitor $C_k$, the quasi-direct current fraction of the photoelectric current cannot reach the base of the transistor T2, it flows from the photodiode (FD) via the resistor R2 and the transistor T3 connected in series with resistor R2. If, on the other hand, short IR pulses (infrared pulses) strike the photodiode (FD), correspondingly short current pulses are produced by the photodiode (FD) and reach the base of the transistor T2 via the capacitor $C_k$. The transistor T1 of the preamplifier stage whose collector is connected to the base of the transistor T3 and via a resistor R3 to the operating potential and whose emitter electrode serves as output of the preamplifier stage acts as a countercoupling. The transistor T4 whose emitter is connected to the collector of the transistor T2 and whose collector is connected to the base of the transistor T1, has the function of compensating the collector base capacitance of the transistor T2.

The high amplification of the arrangement comprising the transistors T2, T4 and T1 acts as a countercoupling when light pulses act upon the photodiode (FD) with the result that the amplified voltage jump at the emitter of the transistor T1 allows a current to flow via the resistor R1 which compensates the current pulses caused by IR pulses at the photodiode. As a result of this compensation, the voltage at the photodiode remains almost constant so that the charge of its barrier layer capacitance does not have to be reversed. This enables short current pulses which are triggered by short IR pulses to be transmitted.

Since the arrangement comprising the transistors T2, T4 and T1 exhibits only finitely large amplification, a $V_{BE}$ change at the transistor T2 is necessary for the current flow via the resistor R1. This $V_{BE}$ change is compensated by the voltage rise at the resistor R3 with the aid of the transistor T3. The transistor T4 serves exclusively to compensate the collector base capacitance of the transistor T2.

What is claimed is:

1. A receiver amplifier for amplification of a photoelectric current, said amplifier comprising: a light-sensitive semiconductor component; an amplifier transistor; a capacitor connected between the light-sensitive semiconductor component and the amplifier transistor for isolating signals with a frequency below a certain threshold delivered by the light-sensitive semiconductor component from the amplifier transistor; and a second transistor connected to said amplifier transistor for producing a current which compensates for changes in the current produced by the light-sensitive semicondutor component in response to light pulses.

2. A receiver amplifier according to claim 1, further comprising a third transistor connected for compensation of the collector base capacitance of the amplifier transistor.

3. A receiver amplifier according to claim 2, wherein the emitter of the third transistor is connected to the collector of the amplifier transistor and the collector of the third transistor is conected to the base of the second transistor.

4. A receiver amplifier according to claim 1, wherein the emitter of the second transistor is connected to the coupling capacitor via a resistor.

5. A receiver amplifier according to claim 1, wherein the output signal of the amplifier is derived at the emitter of the second transistor.

6. A receiver amplifier according to claim 1 further comprising: a source of operating potential for said amplifier; a further transistor; and a first resistor connected to said third transistor to form a series branch with the emitter-collector path of said further transistor, with said series branch being connected between the light-sensitive semiconductor component and the source of operating potential.

7. A receiver amplifier according to claim 6 further comprising a second resistor connected between the collector of the second transistor and the source of operating potential, the second resistor being further connected to the further transistor so that changes in the voltage across the second resistor are effective, via the series branch, at the base of the amplifier transistor to compensate necessary $V_{BE}$ changes at the amplifier transistor.

* * * * *